United States Patent [19]
Takahashi

[11] Patent Number: 5,786,636
[45] Date of Patent: Jul. 28, 1998

[54] SEMICONDUCTOR DEVICE AND METHOD OF FABRICATING SAME

[75] Inventor: Yoshikazu Takahashi, Nagano, Japan

[73] Assignee: Fuji Electric Co., Ltd., Kawasaki, Japan

[21] Appl. No.: 663,995

[22] Filed: Jun. 14, 1996

Related U.S. Application Data

[62] Division of Ser. No. 315,263, Sep. 29, 1994, Pat. No. 5,563,076.

[30] Foreign Application Priority Data

Sep. 29, 1993 [JP] Japan ................................ 5-242266

[51] Int. Cl.⁶ ............................ H01L 23/34; H01L 23/14; H01L 21/44
[52] U.S. Cl. ............................ 257/723; 257/702; 257/701; 437/8; 437/180; 437/205; 437/925
[58] Field of Search ........................ 257/723, 724, 257/726, 702, 701, 700; 437/8, 180, 205, 216, 925; 361/737, 760, 736

[56] References Cited

U.S. PATENT DOCUMENTS

| | | | |
|---|---|---|---|
| 4,313,128 | 1/1982 | Schlegel et al. | 257/785 |
| 5,221,851 | 6/1993 | Gobrecht et al. | 257/150 |
| 5,250,821 | 10/1993 | Ferla et al. | 257/723 |

FOREIGN PATENT DOCUMENTS 0 432 796 A   6/1991   European Pat. Off. ........ 257/178

*Primary Examiner*—Carl W. Whitehead
*Assistant Examiner*—Jhihan B. Clark
*Attorney, Agent, or Firm*—Morrison Law Firm

[57] ABSTRACT

The heights of intermediate terminal boards are adjusted to compensate for differences in heights of semiconductor elements on a bottom terminal board. The adjustment places the tops of all intermediate terminal boards in a common plane. A top terminal board applies equal force to all intermediate terminal board to provide uniform mechanical, electrical and thermal connection between the semiconductor devices and both the bottom and top terminal boards.

4 Claims, 2 Drawing Sheets

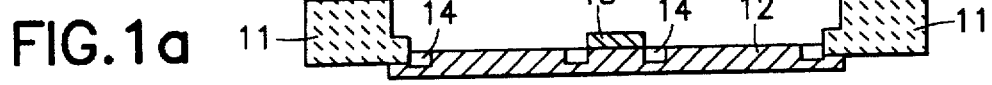
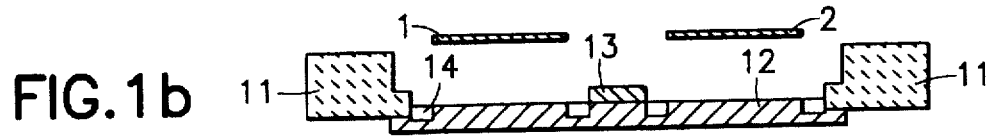
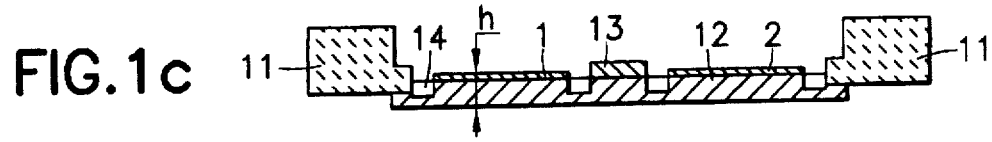
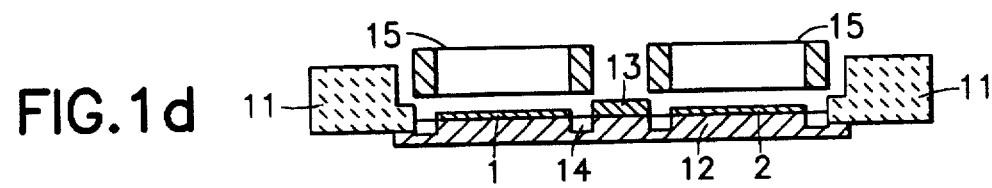
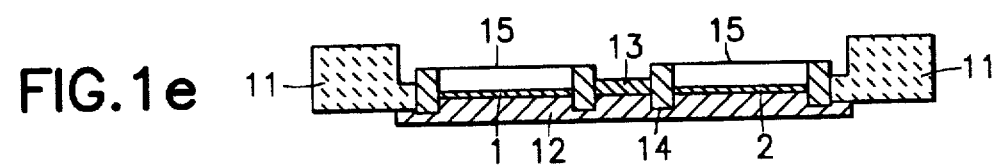
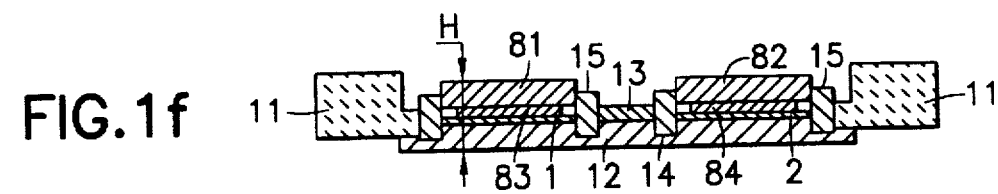
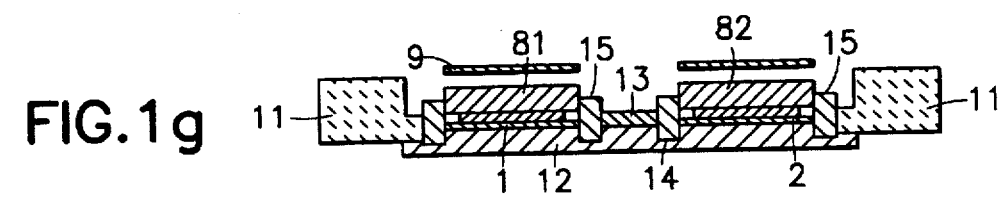
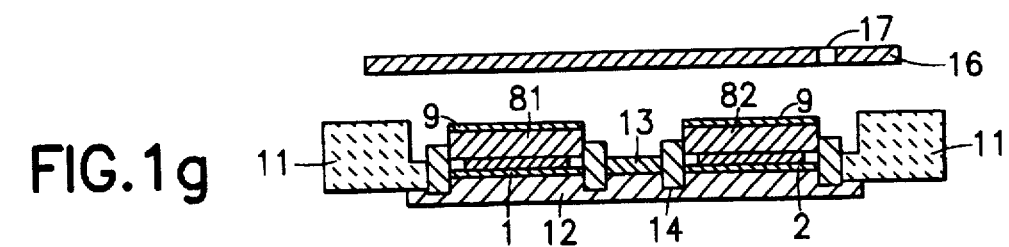
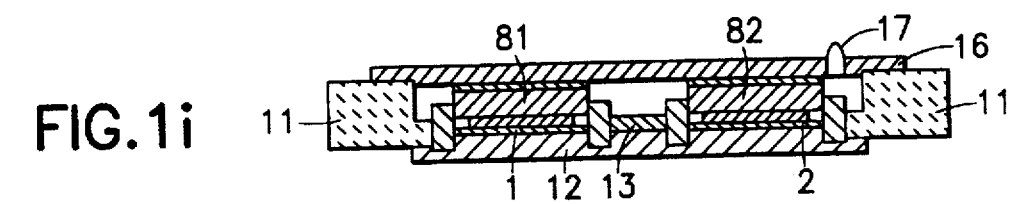

5,786,636

SEMICONDUCTOR DEVICE AND METHOD OF FABRICATING SAME

This is a divisional of application Ser. No. 08/315,263, filed Sep. 29, 1994, now U.S. Pat. No. 5,563,076.

FIELD OF THE INVENTION

The present invention relates to a semiconductor device comprising a plurality of semiconductor elements such as insulated-gate bipolar transistors (IGBTs) received in one container and also to a method of fabricating the semiconductor device.

BACKGROUND OF THE INVENTION

Installing a plurality of semiconductor elements of one or more kinds in one container and modularizing them has found wide acceptance because the capacity is increased and because the labor needed to make wire connections is reduced. For example, what is presently known as an IGBT module includes a single container in which a plurality of IGBT chips and a flywheel diode chip are mounted. Numerous aluminum bonding wires are brought out to make connections from main electrodes (such as emitter and cathode electrodes on the top surfaces of the element chips) and from control electrodes (such as gate electrodes). Accordingly, in this IGBT module, cooling is done only from the collector side on the bottom of each chip.

As described above, connections of the emitters of the IGBT module depends on aluminum wire bonding in which the aluminum wire has a diameter of about 300 μm. Therefore, heat dissipation from the collector side is possible but heat dissipation from the emitter side is very poor. Consequently, current capacity is limited.

In recent years, more compact IGBT modules having greater capacity than conventional modules are required in industrial and vehicular applications. As the capacity of a module is increased, more IGBT chips must be integrated in the module. Hence, it is inevitable that the module itself must be made larger. Also, the number of aluminum wires bonded inside the module is inevitably increased and reaches from several tens to several hundreds. Therefore, reliability problems exist in the presence of vibration. In addition, the aluminum wires and terminals to which the Al wires are connected are lengthened. As a result of the increased lengths, their inductances increase. When a large current is turned off, a resulting voltage surge increases. This is disadvantageous in designing an apparatus.

In one possible solution, wire bonding is not used for emitter connections. Instead top emitter electrodes are held in contact with an emitter terminal board in a plane similar to the technique used in a flat type semiconductor device such as a GTO thyristor. However, where a plurality of IGBT chips and a flywheel diode are connected in parallel and brought into contact with each other under pressure by a common terminal board, any non-uniformity in the distance between the bottom surface of the common terminal board and each electrode on the top surface of each chip before the application of the pressure, then it is impossible to apply uniform pressure to all of the elements in the module. In consequence, uniform energization cannot be accomplished.

OBJECTS AND SUMMARY

It is an object of the present invention to provide a semiconductor device which includes a plurality of semiconductor elements received in a container and in which terminal boards can be brought into contact with electrodes lying on one main surface of each semiconductor element by applying uniform pressure.

It is a further object of the invention to provide a method of fabricating this semiconductor device.

Briefly stated, the present invention provides a semiconductor device in which the heights of intermediate terminal boards are adjusted to compensate for differences in heights of semiconductor elements on a bottom terminal board. The adjustment places the tops of all intermediate terminal boards in a common plane. A top terminal board applies equal force to all intermediate terminal board to provide uniform mechanical, electrical and thermal connection between the semiconductor devices and both the bottom and top terminal boards.

According to an embodiment of the invention, there is provided a semiconductor device comprising: a container, the container including an insulating side wall and top and bottom conductive terminal boards, outer peripheral portions of the top and bottom conductive terminal boards being coupled to top and bottom respectively of the side wall, a plurality of semiconductor elements in the container, electrode plates on bottom surfaces of the semiconductor elements, the electrode plates being rigidly fixed to the bottom conductive terminal board, electrodes on top surfaces of the semiconductor elements, and at least two intermediate terminal boards on the top surfaces, the at least two intermediate terminal boards having protruding portions contacting corresponding electrodes on the semiconductor elements, the at least two intermediate terminal boards having heights differing by an amount sufficient to place top surfaces thereof in a common plane, and the top terminal board pressing on the top surfaces of the at least two intermediate terminal boards, whereby substantially equal pressure is applied to the at least two terminal boards, and to all connections therebelow.

According to a feature of the invention, there is provided a method for fabricating a semiconductor device comprising: affixing a bottom terminal board to a side wall of a container, affixing at least first and second semiconductor elements to the bottom terminal board, measuring first and second device heights from a bottom of the bottom terminal board to a top surface of each of the at least first and second semiconductor elements, adjusting a height of a first intermediate terminal board to a first terminal board value, installing the first intermediate terminal board on the first semiconductor element so that a sum of the first device height and the first terminal board value is equal to a total height, installing a second intermediate terminal board on the second semiconductor device, the second intermediate terminal board having a second intermediate terminal board value, a sum of the second intermediate terminal board value and the second device height being equal to the total height, whereby tops of the first and second intermediate terminal boards lie in a common plane, and affixing a top terminal board over the first and second intermediate terminal boards.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1(a) through FIG. 1(i) are cross sections of a semiconductor device, taken along A—A in FIG. 2, to which reference will be made in describing the apparatus and method of the present invention.

DETAILED DESCRIPTION OF THE PREFERRED EMBODIMENT

Figure 2:
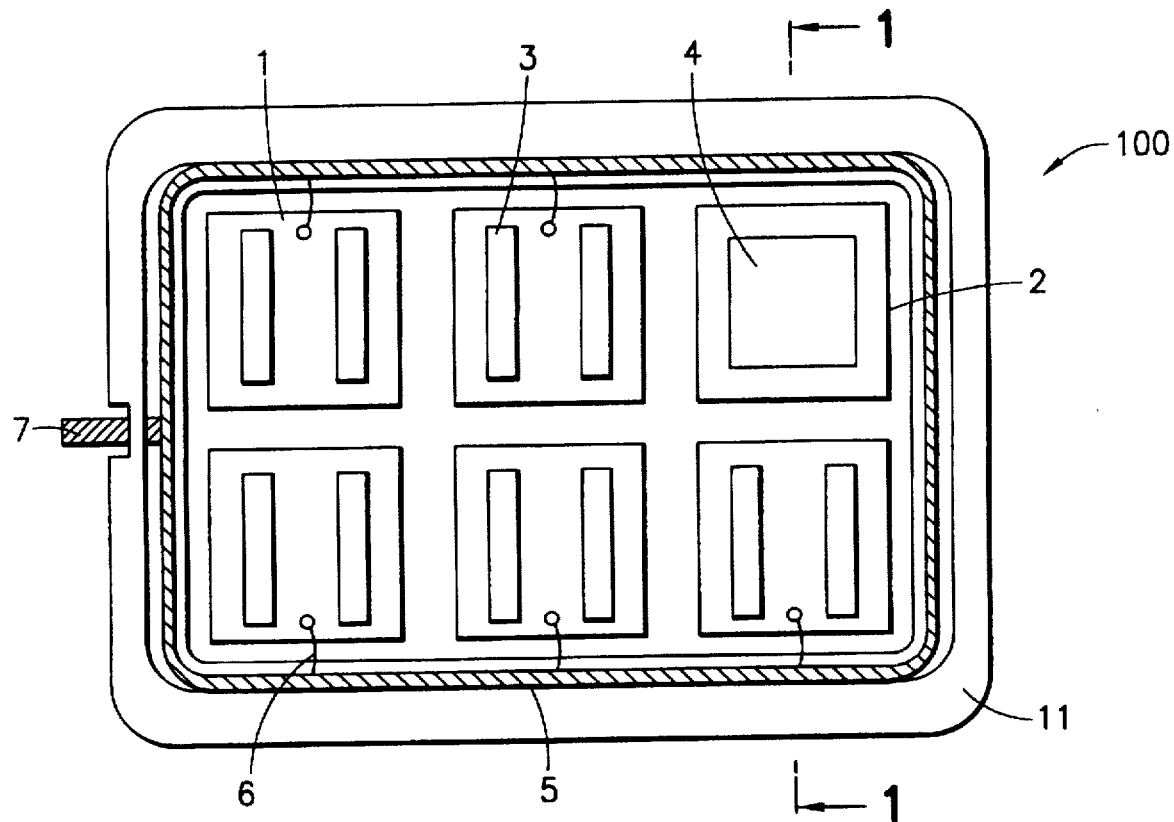
FIG. 2 is a plan view of the lower structure of an IGBT module according to one embodiment of the present invention.

In order to achieve the above-described objects, a semiconductor device according to the present invention includes a container having an insulating side wall and top and bottom conductive terminal boards having their outer peripheral portions in mechanical and thermal connection to top and bottom ends of the side wall. A plurality of semiconductor elements are contained in the container. Electrode plates at bottom surfaces of the semiconductor elements are rigidly fixed to the bottom terminal board. The top terminal board is disposed opposite to electrodes on top surfaces of the semiconductor elements via intermediate terminal boards having individual respective heights. The intermediate terminal boards are brought into contact with electrode surfaces at the top surfaces of the semiconductor elements by the application of pressure to the top terminal board.

If each of the intermediate terminal boards includes a flat portion of a given thickness and a protruding portion having a top surface capable of making contact with the electrode surfaces of the semiconductor elements, and if the heights of the protruding portions are adjustable, then desirable results arise.

A method of fabricating such a semiconductor device comprises the steps of: coupling the insulating side wall of the container to the outer peripheral portion of the bottom terminal board; rigidly securing the electrode plates on sides of the bottom surfaces of the semiconductor elements to the surface of the bottom terminal board; measuring heights of the top electrode surfaces of the rigidly secured semiconductor elements from the outer surface of the bottom terminal board; polishing the heights of the protruding portions of the intermediate terminal boards by thicknesses equal to differences between the measured heights of the top electrode surfaces and a given value; placing the intermediate terminal boards having the polished protruding portions on the semiconductor elements; and coupling the insulating side wall to the outer peripheral portion of the top terminal board. Preferably, the contour of the intermediate terminal boards is made to conform to the contour of the semiconductor elements, and the intermediate terminal boards are placed in position relative to the semiconductor elements and placed on the semiconductor elements, using a cylindrical jig.

The intermediate terminal boards whose heights are adjustable according to the heights of the electrode surfaces of the semiconductor elements are inserted between the top terminal board and the electrode surfaces of the semiconductor elements. Thus, variations in the thickness of the semiconductor elements or variations in the thickness of brazes are compensated for, so that the top surfaces of the intermediate terminal boards lie in the same plane. Pressure applied from the outside to the top terminal board is uniformly applied to the interfaces between the electrode surfaces of the semiconductor elements and the surfaces of the intermediate terminal boards. Dissipating of heat from the semiconductor elements is not limited to the bottom terminal board as in the prior art techniques. Rather, heat is also dissipated from the top terminal board to permit uniform heat dissipation to take place. Consequently, cooling efficiency increases drastically. The heights of the intermediate terminal boards can be easily adjusted by polishing the protrusions on the intermediate terminal boards. The intermediate terminal boards and the semiconductor elements can be easily placed in position relative to each other using a cylindrical jig by conforming the contour of the intermediate terminal boards with the contour of the semiconductor elements.

Referring now to FIG. 2, a container, shown generally at 100, has a ceramic side wall 11. Five 5 IGBT chips 1 and one flywheel diode chip 2 are mounted in container 100. Two emitter electrodes 3 are formed on a top surface of each IGBT chip 1. A cathode electrode 4 is formed on a top surface of diode chip 2. A gate interconnect 5 is laid outside the chips and connected to gate pads of all IGBT chips 1 by aluminum bonding wires 6. Gate interconnect 5 is connected to external circuits by a gate lead 7 extending through side wall 11.

FIGS. 1(a) through 1(i), show steps for assembling the upper structure of this IGBT module.

Referring to FIG. 1(a), a conductive bottom terminal board 12 is brazed to the ceramic container side wall 11. A spacer 13 is firmly secured to the center of bottom terminal board 12. Bottom terminal board 12 includes a groove 14 to permit insertion of a positioning jig (not shown).

Referring now to FIGS. 1(b) and 1(c), IGBT chips 1 and diode chip 2 are fastened to a portion of the surface of the bottom terminal board 12 surrounded by groove 14. Fastening may be performed by any convenient technique such as, for example, by high-temperature soldering, such that collector electrodes of the IGBT chips 1 and an anode electrode of the diode chip 2 face downward.

A difference in thickness between IGBT chips 1 and diode chip 2 is about 200 µm. Also, variations in thickness of the IGBT chips 1 are about ±15 µm. Furthermore, tolerances in the thicknesses of the high-temperature solder layer from chip to chip may vary by about ±30 µm.

A height h of the top surface of each chip from the bottom surface of the terminal board 12 is measured at a resolution of about 0.5 µm using an accurate measuring instrument such as a laser rangefinder.

Referring now to FIGS. 1(d) and 1(e), a positioning cylindrical jig 15 is fitted into groove 14 in bottom terminal board 12.

Referring now momentarily to FIG. 2, gate wires 6 are attached to IGBT chips 1 at this time.

Figure 3:
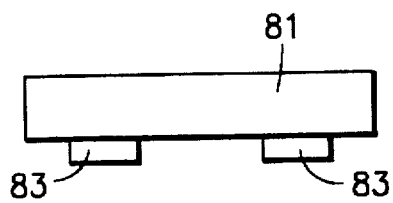
FIG. 3 is a side view of an intermediate circuit board for an IGBT chip.

Referring now also to FIGS. 2 and 3, an intermediate terminal board 81 for IGBT chips 1 includes belt-like protruding portions 83 whose shape corresponds to the two-dimensional shape of emitter electrodes 3. As will be further detailed below, protruding portions 83 fit atop emitter electrodes 3 to provide electrical connection therewith.

Figure 4:
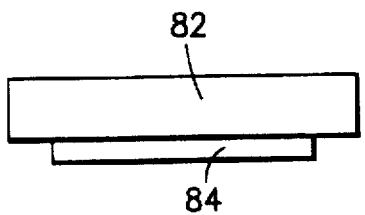
FIG. 4 is a side view of an intermediate circuit board for a diode chip.

Referring now to FIGS. 2 and 4, intermediate terminal board 82 for diode chip 2 includes a square protruding portion 84, whose shape corresponds to the two-dimensional shape of the cathode electrode 4. As will be further detailed below, protruding portion 84 fits upon cathode electrode 4 of diode chip 2.

Referring now to FIG. 1(f), using the previously measured data shown in FIG. 1(c) about the distance h from a bottom surface of bottom terminal board 12 and a top surface of IGBT chip 1 and diode chip 2, the heights of intermediate terminal boards 81 and 82 are reduced until the total height H from the bottom surface of bottom terminal board 12, to the tops of intermediate terminal boards 81 and 82 are equal within very small tolerances of, for example, 1 μm. The height reduction may be performed by grinding with a grinding stone, and is preferably controlled by a personal computer or the like. Either the top surfaces of intermediate terminal boards 81 and 82 may be ground, or the surfaces of protruding portions 83 and 84 thereof may be ground and accurately polished to the required accuracy.

Referring now to FIG. 1(f), the intermediate terminal boards 81 and 82 are inserted into their respective jigs 15. Before proceeding, the heights H are checked.

Referring now to FIG. 1(g), a buffer plate 9, having a thickness of about 100 μm and consisting of oxygen-free copper or the like is affixed over intermediate terminal boards 81 and 82. Buffer plates 9 absorb remaining variations in the height H of the intermediate terminal boards 81 and 82.

Referring now to FIGS. 1(h) and 1(i), a top terminal board 16 is placed atop side wall 11 of container 100, and hermetically sealed in place. An inert gas such as, for example, nitrogen or helium, is fed through a vent hole 17, into the interior of container 100. Vent hole 17 is then sealed off using conventional techniques. As would be clear to one skilled in the art, a vacuum is preferably drawn in container 100 before feeding the inert gas, in order to reduce the amount of air remaining therein after feeding the inert gas and sealing.

According to the present invention, variations in the heights of the top electrode surfaces of a plurality of semiconductor elements due to different thicknesses and other variations in the semiconductor elements are canceled out by compensating heights of intermediate terminal boards positioned between the electrode surfaces and the top terminal board. Pressure applied from the outside to the top terminal boards brings the semiconductor elements into uniform contact with the top terminal board, so that reliable connections are made. In this way, conductive cooling from both surfaces of a plurality of semiconductor elements in one container is achieved. In consequence, the current capacity is increased, and the inductance is decreased.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor device comprising:

a container;

said container including an insulating side wall and top and bottom conductive terminal boards;

outer peripheral portions of said top and bottom conductive terminal boards being coupled to top and bottom respectively of said side wall;

a plurality of semiconductor elements in said container;

electrode plates on bottom surfaces of said semiconductor elements, said electrode plates being rigidly fixed to said bottom conductive terminal board;

electrodes on top surfaces of said semiconductor elements; and at least two intermediate terminal boards on said top surfaces;

said at least two intermediate terminal boards having protruding portions contacting corresponding electrodes on said semiconductor elements;

said at least two intermediate terminal boards having heights differing by an amount sufficient to place top surfaces thereof in a common plane; and said top terminal board pressing on said top surfaces of said at least two intermediate terminal boards, whereby substantially equal pressure is applied to said at least two terminal boards, and to all connections therebelow.

2. A device according to claim 1, further comprising a buffer plate between each top surface of said at least two intermediate terminal boards and said top terminal board.

3. A device according to claim 1, further comprising:

a jig surrounding at least one of said semiconductor elements; and said jig positioning said intermediate terminal board.

4. A device according to claim 3, further comprising:

a groove in said bottom terminal board; and said jig fitting into said groove.

* * * * *